United States Patent [19]
Kobayashi et al.

[11] Patent Number: 6,030,510
[45] Date of Patent: *Feb. 29, 2000

[54] HOT REFLOW SPUTTERING METHOD AND APPARATUS

[75] Inventors: Masahiko Kobayashi, Kanagawa-ken; Nobuyuki Takahashi, Sagamihara, both of Japan

[73] Assignee: Anelva Corporation, Fuchu, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/151,738

[22] Filed: Sep. 11, 1998

[30] Foreign Application Priority Data

Oct. 9, 1997 [JP] Japan .................................. 9-293458

[51] Int. Cl.[7] .................................................. C23C 14/34
[52] U.S. Cl. ............................... 204/192.12; 204/298.09; 204/298.15
[58] Field of Search ........................ 204/192.12, 192.15, 204/298.07, 298.09, 298.15, 298.16, 298.17, 298.19, 298.25, 298.26; 438/632, 642, 688; 118/724, 725, 730, 50; 156/345

[56] References Cited

U.S. PATENT DOCUMENTS

| | | | |
|---|---|---|---|
| 4,970,176 | 11/1990 | Tracey et al. ........................... | 437/187 |
| 5,267,607 | 12/1993 | Wada ...................................... | 165/80.1 |
| 5,270,255 | 12/1993 | Wong ...................................... | 437/194 |
| 5,318,923 | 6/1994 | Park ........................................ | 437/188 |
| 5,775,416 | 7/1998 | Heimanson et al. ................ | 204/298.07 |

*Primary Examiner*—Nam Nguyen
*Assistant Examiner*—Gregg Cantelmo
*Attorney, Agent, or Firm*—Burns, Doane, Swecker & Mathis, LLP

[57] ABSTRACT

A method and apparatus for facilitating high-quality hot reflow sputtering with no occurrence of voids while reducing the processing time by rapid heating of the substrate. The method comprises two steps. In the first step, a thin base film 81 of aluminum is formed on the side and bottom surfaces of a minute hole 90 formed in the surface of a substrate 9. Substrate 9 is heated to a first temperature of no more than 100° C. at which it is possible to prevent gaps occurring in the base film 81. In the second step, the hole is filled in with aluminum by depositing a further film of aluminum 82 inside hole 90 and causing it to reflow. Substrate 9 is heated to a second temperature which is higher than the first temperature. The hot reflow sputtering apparatus is equipped with an electrostatic attraction mechanism 43, which uses static electricity to grip substrate 9 against a substrate holder 4 provided with an indentation 40 in the substrate mounting surface thereof, and a pressurizing gas introduction system 42 which introduces a pressurizing gas into the indentation 40. A control unit 47 controls the apparatus so that neither electrostatic attraction mechanism 43 nor pressurizing gas introduction system 42 are operated in the first step. In the second step the pressurizing gas introduction system 42 is operated after the electrostatic attraction mechanism 43 has been operated.

13 Claims, 6 Drawing Sheets

HOT REFLOW SPUTTERING METHOD AND APPARATUS

CROSS-REFERENCE TO RELATED APPLICATION

Pursuant to 35 U.S.C. § 119, this application claims the benefit of priority of earlier filed application Ser. No. 9-293458, filed in Japan on Oct. 9, 1997; the entire content of which is hereby incorporated by reference.

BACKGROUND OF THE INVENTION

1. Field of the Invention

The present invention relates to a hot reflow sputtering method and apparatus for filling holes formed in a substrate with a metallic material.

2. Description of the Related Art

Sputtering techniques that produce a desired thin film on the surface of a substrate by sputtering a target are often used in the production of semiconductor integrated circuits. In most cases, the semiconductor wafers on which thin films are formed have minute holes. As a result, it has been necessary to produce thin films inside these minute holes. For example, a DRAM (dynamic random access memory) with a capacity of 256 Mbit to 1 Gbit requires films to be deposited in channels and holes (referred to collectively as "holes" in the present specification) with a design rule or diameter of 0.25 $\mu$m to 0.18 $\mu$m.

Hot reflow sputtering, which fills in holes with a metallic material, is a practical mass-production technique that uses sputtering for the deposition of films inside such holes. FIG. 6 is a front view outlining the configuration of a conventional hot reflow sputtering apparatus that performs this sort of hot reflow sputtering.

The sputtering apparatus shown in FIG. 6 has a sputtering chamber 1 equipped with a pumping system 11 and a process gas introduction system 5 which introduces a process gas inside sputtering chamber 1. Inside sputtering chamber 1 are situated a target 2, which is provided so as to expose the surface 20 that is to be sputtered, a sputtering power source 3 for sputtering target 2, and a substrate holder 4 for positioning the substrate 9. A heater 6 is provided inside substrate holder 4 to heat substrate 9 to the desired temperature. Heater 6 is equipped with a control unit 7 which controls heater 6.

Target 2 is made of a metal such as aluminum, and is attached to sputtering chamber 1 via an insulating material 21. Sputtering power source 3 applies a large negative voltage to target 2. A process gas such as argon is introduced into sputtering chamber 1 by process gas introduction system 5. As the large negative voltage is applied to target 2, a DC field is established between the target and parts that are at ground potential, such as the substrate holder 4 and the walls of sputtering chamber 1. A sputtering discharge is caused by this DC field. Particles of the metallic material (usually in the form of atoms referred to as sputtered particles in this specification) that are discharged from target 2 by this sputtering discharge arrive at substrate 9, and a thin film of the desired metallic material is built up.

Meanwhile, the heat from heater 6 is applied to substrate 9 by way of substrate holder 4. Heater 6 is controlled by control unit 7 so that substrate 9 is kept at a fixed temperature. The thin film that has been built up on the surface of substrate 9 is fluidized (reflow) by the heat of substrate 9, and the minute holes are thereby filled in. As a result, the holes are filled in with metallic material, and the surface of substrate 9 is made smooth.

In the hot reflow sputtering mentioned above, the substrate must be heated to a high temperature of 400° C. to 500° C. or so. However, in conventional apparatus it is difficult to heat the substrate to such high temperatures in a short period of time—conventional apparatus has required a long processing time of at least 200 to 300 seconds or thereabouts, which has severely impaired the productivity.

As a result of investigating the configuration for heating the substrate, the present inventors have devised a configuration that allows the substrate to be heated rapidly. However, tests performed using this configuration have demonstrated that although the processing time can be reduced by rapid heating of the substrate, holes that should have been filled in with the metallic material end up containing cavities. or "voids" as they are known.

SUMMARY OF THE INVENTION

The invention of the present application has been made in order to solve this problem, and aims to facilitate defect-free hot reflow sputtering with no occurrence of voids while reducing the processing time by heating the substrate rapidly.

To solve the abovementioned problems, the invention is directed to a hot reflow sputtering method that fills in minute holes formed in a substrate with a metallic material. This invention comprises a first step in which a thin base film of the metallic material is formed on the side and bottom surfaces of the holes, and a second step which is performed after the first step and in which the thin film of metallic material is further built up inside the holes and made to reflow, thereby filling in the holes with the metallic material.

In the first step, the substrate is heated to a first temperature at which it is possible to prevent gaps in the base film that is produced. In the second step, reflow is performed while the substrate is heated to a second temperature that is higher than the first temperature.

Preferably, the metallic material is aluminum or an aluminum alloy (e.g., containing 0.5% copper), and the first temperature is 100° C. or less.

The present invention also relates to a hot reflow sputtering apparatus that produces a thin film of metallic material by sputtering on the surface of a substrate in which minute holes have been formed, and which levels off the holes by filling in the holes with a metallic material by heating the substrate and causing the thin film to reflow.

The apparatus comprises a sputtering chamber equipped with a pumping system, a target provided so as to be exposed to the sputtered surface inside the sputtering chamber, a sputtering power source for sputtering the target, a substrate holder for positioning the substrate inside the sputtering chamber where it can be reached by target material emitted by sputtering, and a heater that heats the substrate.

The apparatus is also equipped with a control unit that controls the overall apparatus. The control unit controls the apparatus so that during the first step, in which the base film of the metallic material is produced on the side and bottom surfaces of the hole, the substrate is heated to a low first temperature at which gaps in the base thin film are prevented. The control unit also controls the apparatus so that in the second step, which is performed after the first step, the substrate is heated to a second temperature which is higher than the first temperature and at which the thin film of metallic material is further built up inside the hole and made to reflow.

Preferably, the substrate holder has an indentation formed in the surface on which the substrate is placed and has a pressurizing gas introduction system which introduces a pressurizing gas into this indentation. Furthermore, the apparatus is provided with an electrostatic attraction mechanism which grips the substrate against the holder with static electricity. The control unit is operated so that neither the electrostatic attraction mechanism nor the pressurizing gas introduction system are operated in the first step, whereas the electrostatic attraction mechanism and the pressurizing gas introduction system are operated in the second step.

Also preferably, the control unit initially only operates the electrostatic attraction mechanism in the second step, and operates the pressurizing gas introduction system thereafter. The target is preferably made of aluminum or an aluminum alloy, and the first temperature is 100° C. or less.

DETAILED DESCRIPTION OF THE INVENTION

An implementation of the present invention is described below.

Figure 1:
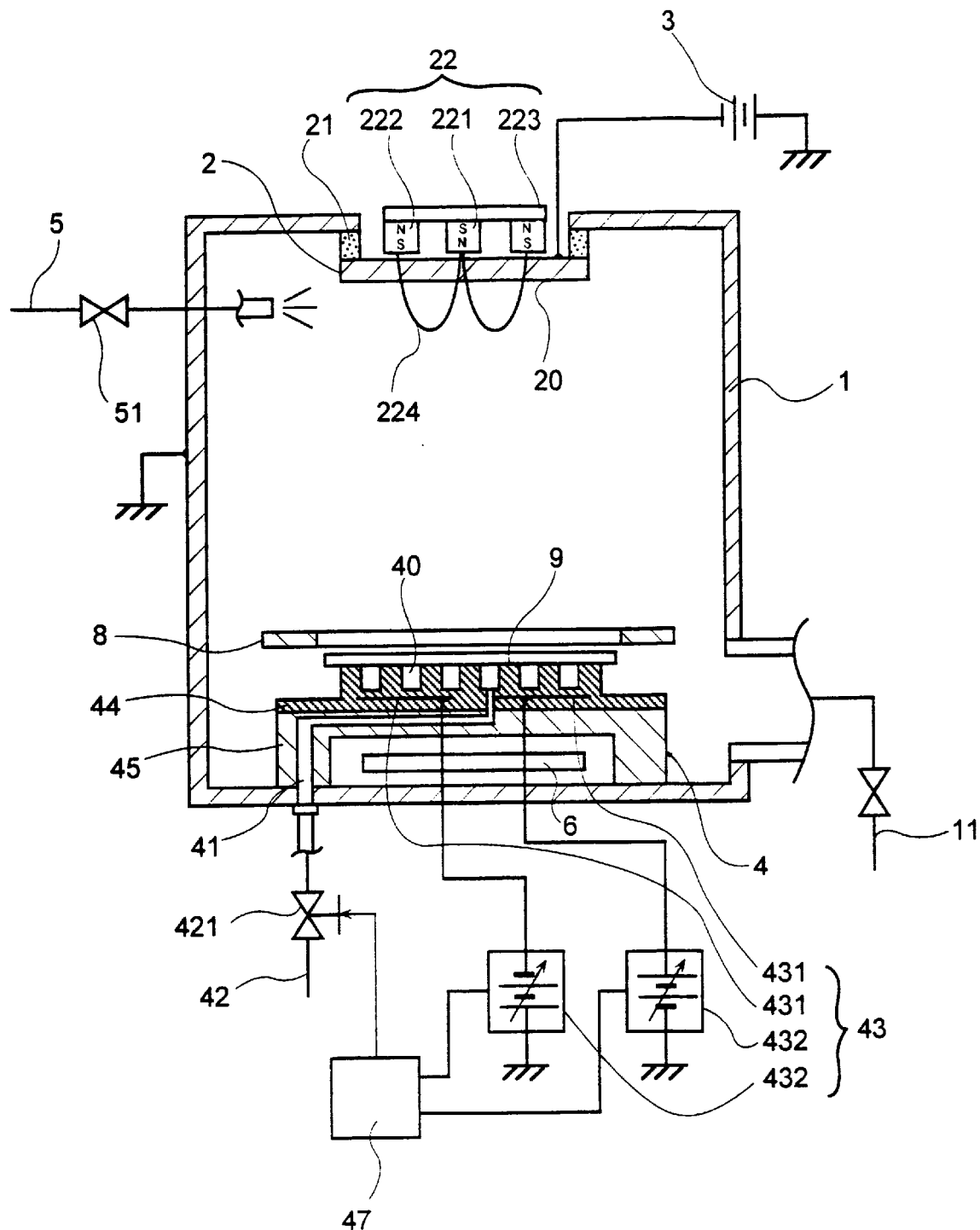
FIG. 1 is a front view outlining the configuration of a hot reflow sputtering apparatus according to an implementation of the present invention.

FIG. 1 is a front view outlining the configuration of a hot reflow sputtering apparatus according to an implementation of the present invention. The hot reflow sputtering apparatus shown in FIG. 1 has a sputtering chamber 1 equipped with a pumping system 11 and a process gas introduction system 5 which introduces a process gas inside sputtering chamber 1. Inside sputtering chamber 1 are situated a target 2, which is provided so as to expose the surface 20 that is to be sputtered, a sputtering power source 3 for sputtering target 2, a substrate holder 4 on which the substrate 9 is placed, and an anti-deposition shield 8. A heater 6 is provided inside substrate holder 4 to heat substrate 9 to the desired temperature. The hot reflow sputtering apparatus is also equipped with a control unit 47 that controls the entire apparatus.

Sputtering chamber 1 is an airtight vessel made of stainless steel, and is electrically earthed. Sputtering chamber 1 is provided with a gate valve (not illustrated). Substrate 9 is introduced into and withdrawn from the sputtering chamber 1 from a transfer chamber and/or load lock chamber (not illustrated) via the gate valve to exclude atmospheric pressure.

Pumping system 11 is equipped with a multi-stage vacuum pump comprising a turbo-molecular pump and/or cryo-pump. Pumping system 11 pumps down the interior of the sputtering chamber to about $10^{-8}$ Torr. Pumping system 11 is provided with a pumping speed regulator such as a variable orifice (not illustrated). The pumping speed regulator allows pumping system 11 to pump at the desired rate.

A target 2 is attached to sputtering chamber 1 via an insulating material 21. In the present mode of implementation, target 2 is made of aluminum or an aluminum alloy.

A sputtering power source 3 is made to apply a large negative voltage of about −500 to −700 V to target 2. This large negative voltage establishes a DC field between target 2 and substrate holder 4, which causes a sputtering discharge to take place.

A magnet assembly 22 is provided behind target 2. Magnet assembly 22 causes a magnetron discharge to be achieved. Magnet assembly 22 is configured from a central magnet 221, a circular peripheral magnet 222 which encloses central magnet 221, and a planar yoke 223 to which the central magnet 221 and peripheral magnet 222 are fixed. An arch-shaped magnetic flux 224 which passes through target 2 is established between central magnet 221 and peripheral magnet 222. If electrons are enclosed by the region bounded by this magnetic flux and the sputtered surface 20 of target 2, the neutral gas molecules are ionized highly efficiently. As a result, the sputtering discharge is efficiently maintained, and a large number of sputtered particles are emitted so that a high film deposition rate is obtained.

The DC electric field established by sputtering power source 3 is oriented perpendicularly to the sputtered surface 20 of target 2. The magnetic and electric fields intersect at right angles near the apex of the arch-shaped magnetic flux 224, whereby a magnetron discharge is achieved. The electrons perform magnetron motion and gyrate around the central axis of target 2, thereby further improving the efficiency of the sputtering discharge.

The process gas required for the sputtering discharge is introduced by process gas introduction system 5. Process gas introduction system 5 is configured from a gas cylinder (not illustrated) filled with process gas, and a valve 51 or mass-flow controller (not illustrated) provided in a pipe connecting the gas cylinder to sputtering chamber 1. When the sputtering discharge is maintained solely by the ionization of sputtered particles emitted from target 2, it may not be necessary to introduce a process gas.

A characteristic feature of the hot reflow sputtering apparatus of the present mode of implementation is the configuration for rapid heating of the substrate, which is described below. A radiative heater 6 is also provided inside substrate holder 4 in the present mode of implementation. This heater 6 might be, for example, a radiative heating lamp with a power of about 1 kW. Alternatively, heater 6 might be configured by embedding a resistive heater into substrate holder 4.

Substrate holder 4 has a gas introduction path 41 through which a pressurizing gas is introduced into indentation 40 formed in the surface on which the substrate is mounted. A pressurizing gas introduction system 42 is connected to gas introduction path 41. Examples of pressurizing gases that can be used include argon and helium.

The apparatus of the present mode of implementation is provided with an electrostatic attraction mechanism 43, which grips substrate 9 against substrate holder 4 by static electricity. Electrostatic attraction mechanism 43 is principally configured from a pair of electrostatic attraction electrodes 431 which are embedded in a dielectric block 44 provided as a part of substrate holder 4, and an electrostatic attraction power source 432 which applies a DC voltage between the pair of electrostatic attraction electrodes 431.

Dielectric block 44 is made of a dielectric such as alumina. Dielectric block 44 is securely bonded to a holder main body 45 which is made of metal. The dielectric block 44 and holder main body 45 are bonded together with adhesive or by a mechanical fixing method. If a buffer material such as a thin carbon sheet is interspersed between them, they can be firmly bonded together while maintaining good thermal conductivity between them.

Electrostatic attraction power source 432 applies a voltage of between 300 V and 1 kV or thereabouts between the pair of electrostatic attraction electrodes 431. This voltage gives rise to dielectric polarization in dielectric block 44 and induces static electricity on its surface. Substrate 9 is gripped against dielectric block 44 by this static electricity. As a result, the gripping of substrate 9 by substrate holder 4 is improved, and leakage of the pressurizing gas from indentation 40 is effectively prevented.

By preventing the pressurizing gas from leaking out a sufficient pressure difference is produced between the atmosphere inside sputtering chamber 1 and the interior of indentation 40. Even if it is desired that the interior of sputtering chamber 1 should be held at vacuum pressure, a considerable pressure can still be maintained inside indentation 40. The heat from heater 6 is efficiently transmitted to substrate 9 via substrate holder 4, allowing substrate 9 to be rapidly heated.

Figure 2:
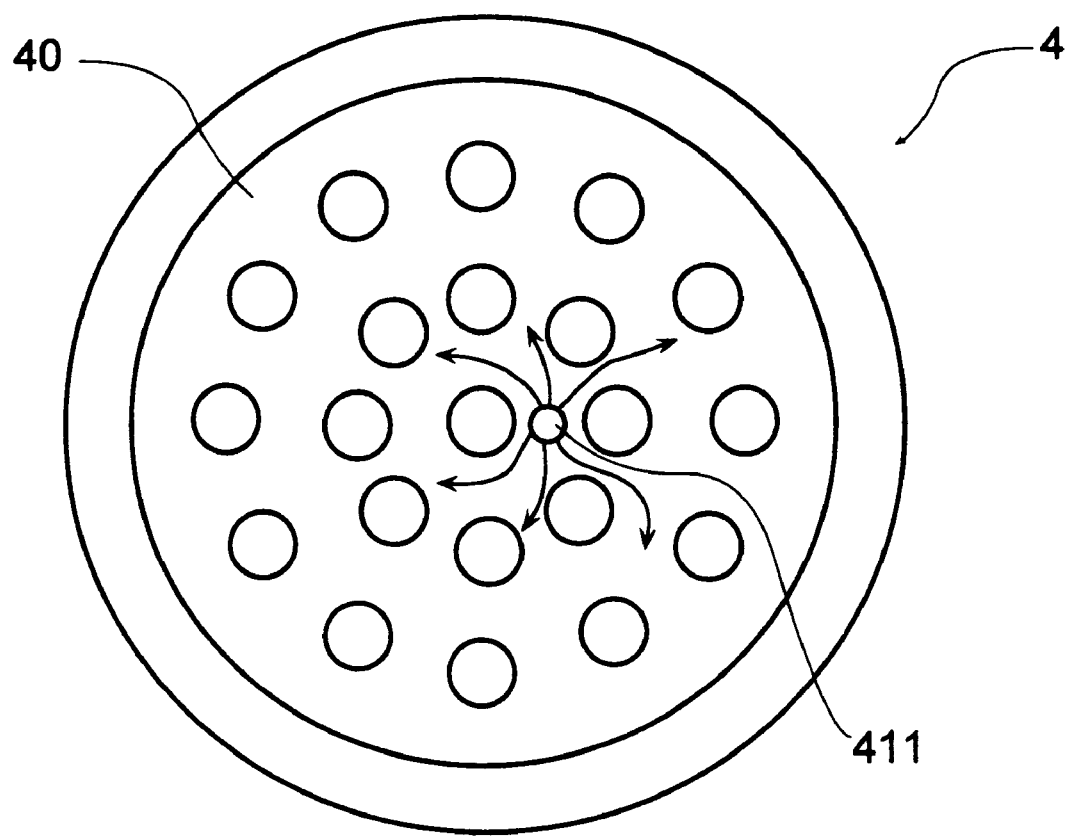
FIG. 2 is a plan view outlining the shape of indentation 40 in the substrate holder 4 shown in FIG. 1.

The shape of indentation 40 formed in the substrate mounting surface of substrate holder 4 is described in further detail below. FIG. 2 is a plan view outlining the shape of indentation 40 in the substrate holder 4 shown in FIG. 1.

As FIGS. 1 and 2 show, the indentation in the apparatus of the present mode of implementation is formed from an annular projection extending around the outer edge and a small cylindrical projection interspersed on the inside of this annular projection. The outlet 411 of gas introduction path 41 is formed near the center, and the gas guided into indentation 40 from outlet 411 fills the indentation 40 by diffusing through the cylindrical projection.

An indentation 40 with this sort of configuration is useful for increasing the proportion of the surface area of the substrate mounting surface that is in direct contact with substrate 9. If the proportion of the surface area in direct contact with substrate 9 is increased with an indentation 40 as described above, the overall gripping force is increased, and it is able to grip substrate 9 with adequate reliability. If indentation 40 has a simple shape such as a circle in plan view, then the proportion of the surface area of the substrate mounting surface that makes direct contact with substrate 9 becomes smaller. With an indentation having a shape such as a circle, it may not even be possible to grip substrate 9 sufficiently when it is gripped by electrostatic attraction mechanism 43.

The anti-deposition shield 8 is provided to prevent deposition on unwanted surfaces inside the sputtering chamber 1. The shield 8 may be made of a metal such as stainless steel. It is detachably fixed to the sputtering chamber 1 by means of a fixing member (not shown). The anti-deposition shield 8 is electrically held at ground potential. The shield 8 is cleaned when the thin film deposited thereon has reached a predetermined thickness. The surface of the anti-deposition shield is roughened by, for example, sand blasting, in order to prevent exfoliation or separation of the deposited thin film.

Another important characteristic feature of the apparatus according to the present mode of implementation is control unit 47, the configuration of which is described below. In the present mode of implementation, control unit 47 optimizes the operation of the apparatus so that the occurrence of voids is suppressed even when the processing time is made shorter by heating substrate 9 rapidly.

More specifically, control unit 47 is provided for optimizing the timed relation between the operation of the electrostatic attraction mechanism 43 and the operation of the pressurizing gas introduction system 42. The control system 47 allows the pressurizing gas introduction system 42 to operate only after a predetermined period from the operation of the electrostatic attraction mechanism 43, i.e., after the electrostatic attraction has been stabilized.

The electrostatic attraction of the substrate 9 performed by the electrostatic attraction mechanism 43 serves to effectively seal the pressurizing gas in the recess 40. Starting of the pressurizing gas introduction system 42 prior to or substantially concurrently with the electrostatic attraction of the substrate 9 onto the substrate holder 4, however, causes insufficient electrostatic attraction of the substrate 9 on the substrate holder 4, despite the operation of the electrostatic attraction mechanism 43.

To explain in more detail, if the operation of the electrostatic attraction mechanism 43 is started while the pressurizing gas has already been introduced into the recess 40, the induced electrostatic charges cannot provide sufficient electrostatic attracting effect due to the presence of the pressurizing gas flooding over the recess 40. In view of this problem, in the illustrated embodiment, the control unit 47 provides a time lag between the operation of the electrostatic attracting mechanism 43 and the operation of the pressurizing gas introduction system 42. In particular, the control unit 47 sends a control signal to an attracting power supply 432 so as to initiate the electrostatic attraction of the substrate 9. After lapse of a predetermined time from the start of the attraction, the control unit 47 sends another control signal to a valve 421 of the pressurizing gas introduction system 42 so as to open the valve 421, thereby allowing introduction of the pressurizing gas.

With this arrangement, it is possible to overcome the above-described problem of insufficient electrostatic attraction of the substrate 9. The time lag may be, for example, 5 to 10 seconds.

In the apparatus of the present mode of implementation, the efficiency of heat transfer is increased by gripping substrate 9 electrostatically against substrate holder 4 and by introducing a pressurizing gas into the indentation 40 provided in the substrate mounting surface of substrate holder 4. With this configuration, the substrate temperature can be increased much faster than with a conventional apparatus, and the time required for hot reflow sputtering can be reduced.

However, the present inventors' studies have shown that simply increasing the rate at which substrate 9 is heated can give rise to voids inside the holes and lead to faulty devices. This problem is described below.

Figure 3:
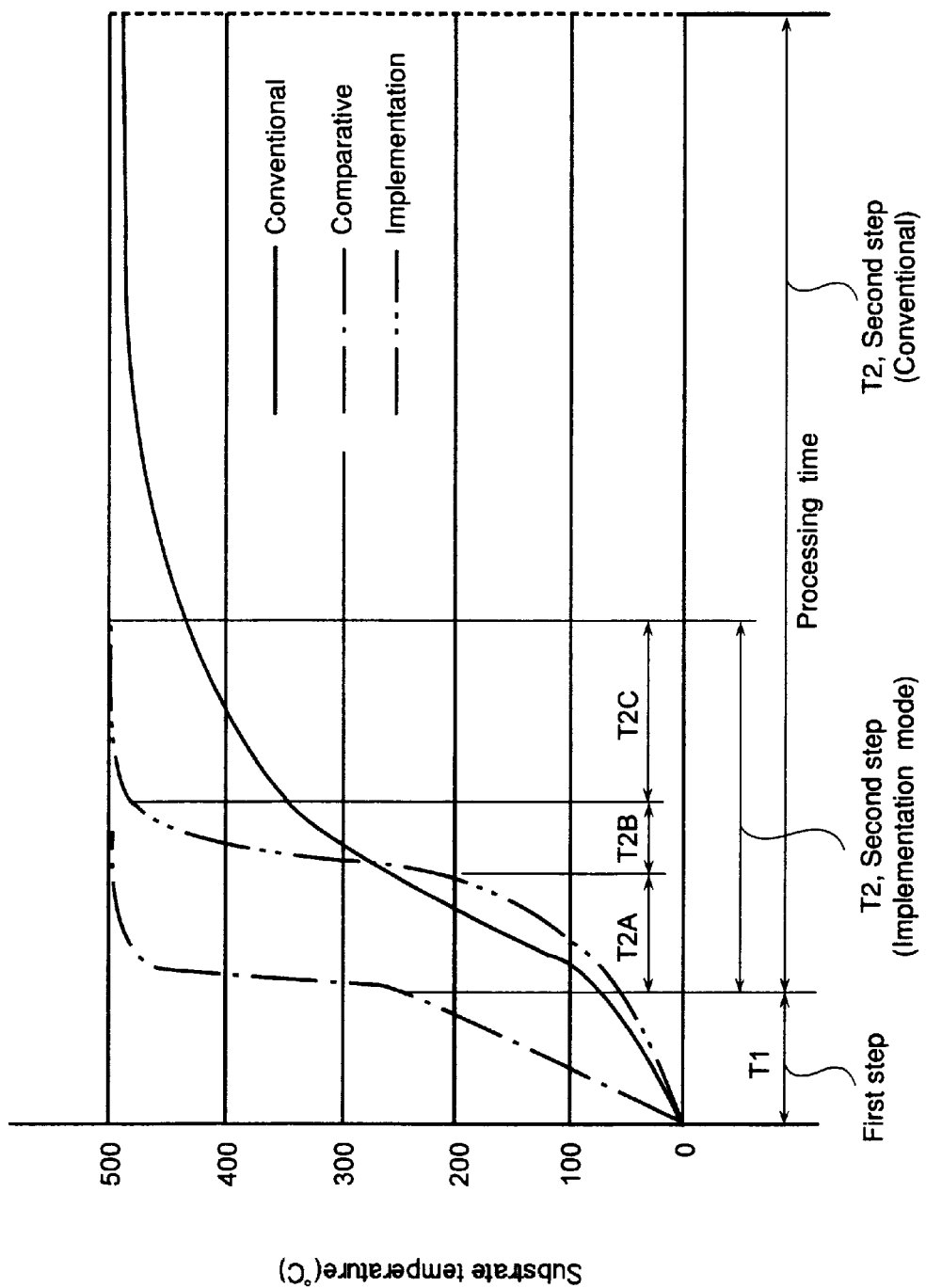
FIG. 3 is a graph showing the pattern of substrate temperature increases during hot reflow sputtering performed using a conventional apparatus, an apparatus according to the present implementation, and a comparative apparatus.

FIG. 3 shows the pattern of substrate temperature increases during hot reflow sputtering performed using an apparatus according to the present invention, a conventional apparatus, and a comparative apparatus. In FIG. 3, the solid line is the temperature increase pattern in the conventional apparatus, the dashed line drawn with single dots is the temperature increase pattern of the comparative apparatus, and the dashed line drawn with double dots is the temperature increase pattern of the apparatus of the present mode of implementation. Note that the substrate temperature was measured with a thermal radiation sensor.

As the solid line in FIG. 3 shows, the conventional apparatus requires a time of at least 200 to 300 seconds to heat the substrate to 400° C. to 500° C. or so and complete the hot reflow sputtering.

On the other hand, the temperature increase pattern shown by the dashed line drawn with single dots was obtained with the comparative apparatus. Apart from control unit 47, the comparative apparatus had the same configuration as the present mode of implementation. The control unit 47 of the comparative apparatus was configured so that pressurizing gas introduction system 42 was not operated when electrostatic attraction mechanism 43 was operated at time T1 immediately after starting the sputtering, but operated the electrostatic attraction mechanism 43 and pressurizing gas introduction system 42 at a later time T2. T1 is the period from 0 to 10 seconds or so after the start of the process, and T2 is the period from 10 to 100 seconds or so after.

Figure 4:
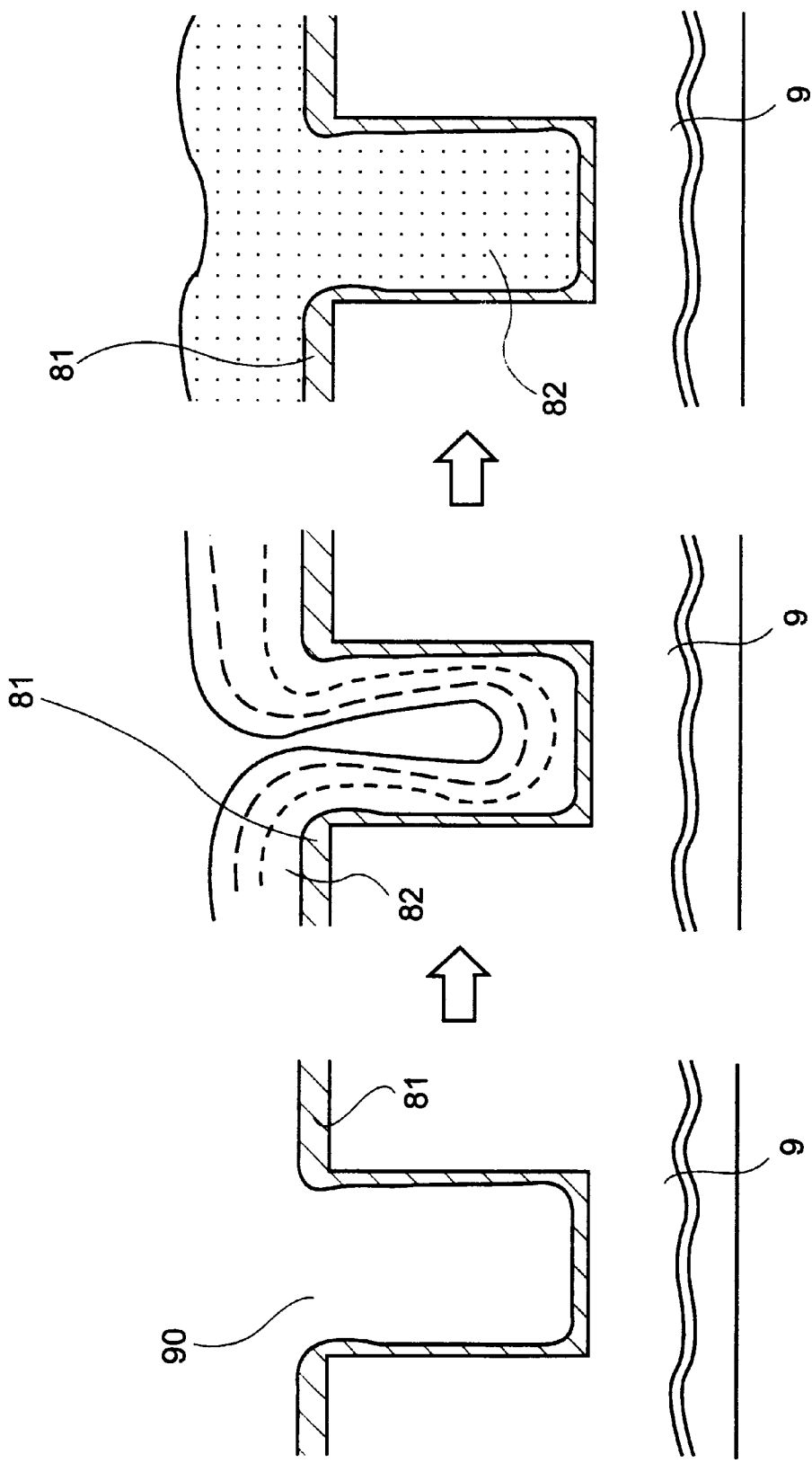
FIGS. 4(A)–4(C) are cross-sectional views of hole 90 showing how hot reflow sputtering normally progresses when no voids occur.
Figure 5:
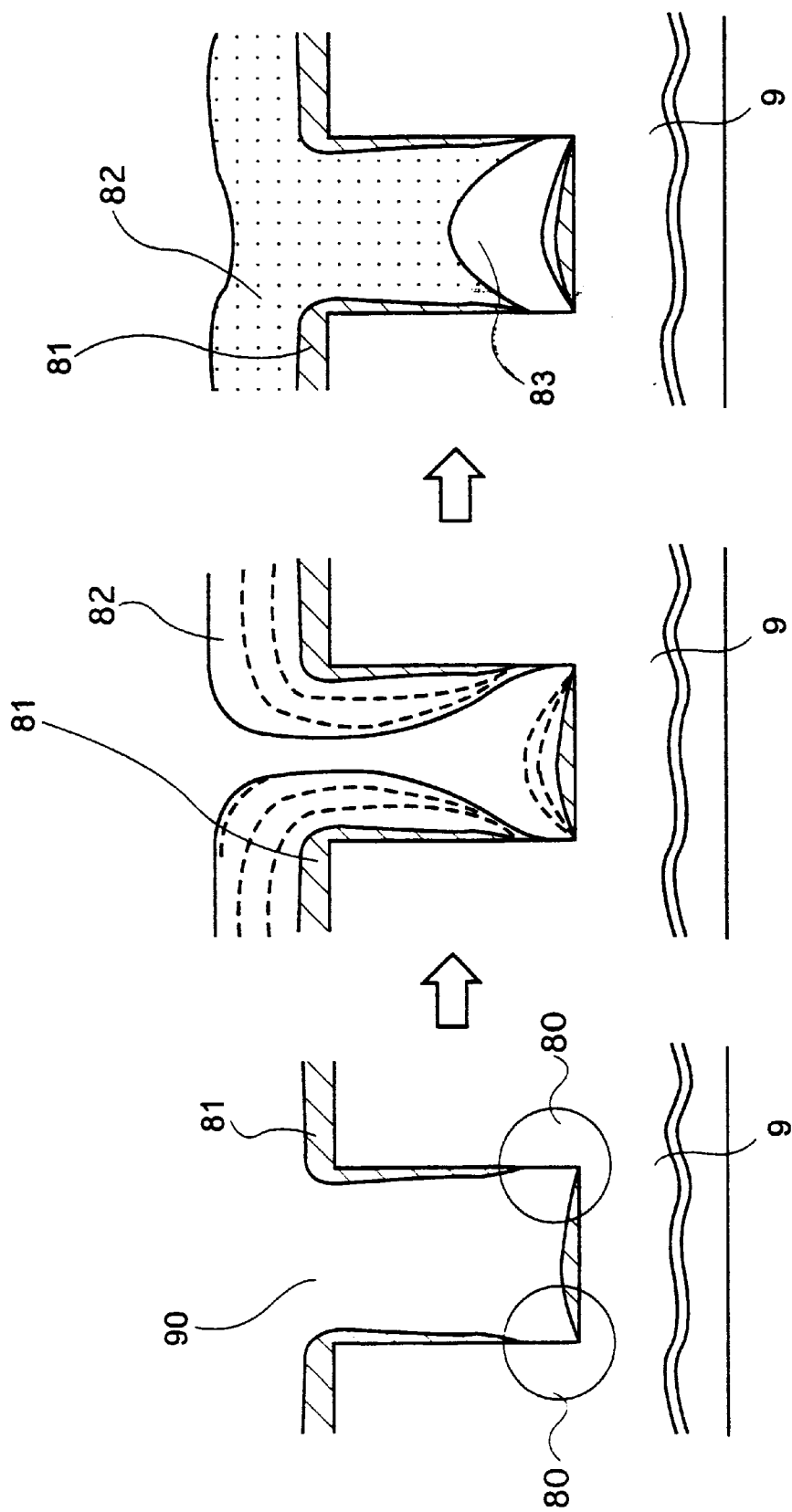
FIGS. 5(A)–5(C) are cross-sectional views of hole 90 showing how hot reflow sputtering progresses when voids do occur.
Figure 6:
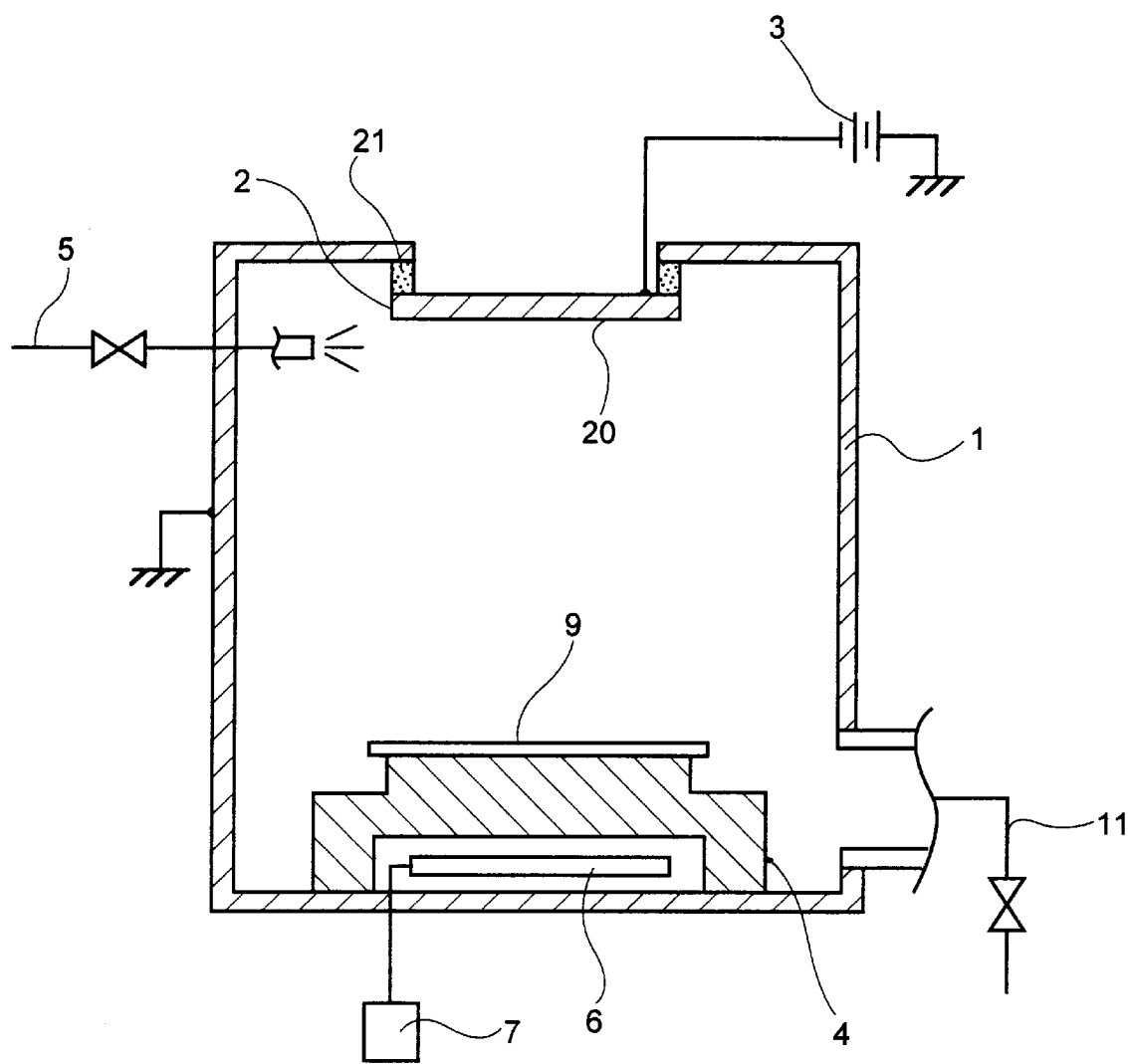
FIG. 6 is a front view outlining the configuration of a conventional hot reflow sputtering apparatus.

With this sort of configuration it was confirmed that voids occurred inside the holes that had been filled in with metallic material. FIGS. 4(A)–4(C) and 5(A)–5(C) illustrate the mechanism whereby voids occur during rapid heating. FIG. 4(A)–4(C) show what happens in normal hot reflow sputtering where voids do not occur, and FIG. 5(A)–5(C) show what happens in hot reflow sputtering when voids do occur.

Once sputtering has started in normal hot reflow sputtering, a thin film 81 is first deposited on the surface of substrate 9 as shown in FIG. 4(A). This thin film 81 forms the foundation whereby the interior of hole 90 is filled in by the subsequent reflow. This thin film 81 is referred to as a "base film" in the present specification. The thickness of this base film 81 is about 1000 to 4000 Angstroms.

If substrate 9 is heated while building up another thin film 82 on top of this base film 81, thin film 82 is fluidized as shown in FIG. 4(B) (hereinafter referred to as "reflow film 82"), and flows into hole 90. Then, as shown in FIG. 4(C), hole 90 is completely filled in by reflow film 82, and the surface of substrate 9 is smoothed out.

In the temperature increase pattern of the abovementioned comparative apparatus shown by the dashed line drawn with single dots in FIG. 3, the substrate is rapidly heated from room temperature to about 200° C. in time T1. The temperature of the substrate at time T1 after the start of sputtering is much higher than in the case of the conventional apparatus as shown by the solid line. If the substrate reaches a very high temperature at the time at which sputtering is started in this way, the base film 81 initially deposited is promptly fluidized and the surface tension increases. As a result, it is thought that gaps can occur in base film 81, as indicated by parts 80 in FIG. 5(A). The gaps 80 in base film 81 are thought to occur in large numbers at the bottom ends of the side walls of holes 90 where the deposition rate is slow.

In the following period T2, even if reflow is made to occur while continuing to build up thin film 82, the reduced affinity at gaps 80 where the underlying material is exposed means that reflow film 82 is unable to cover these parts as shown in FIG. 5(B). As a result, it is thought that a void 83 will form in reflow film 82 even when hole 90 is filled in with reflow film 82, as shown in FIG. 5(C). If a void 83 is formed, an open circuit will occur if thin films 81 and 82 are used for metallic wiring, resulting in a fatal apparatus defect. If thin films 81 and 82 are insulating films, the insulator breakdown voltage will be impaired.

On the other hand, in the temperature increase pattern of the apparatus of the present mode of implementation shown by the dashed line drawn with double dots in FIG. 3, no occurrence of voids 83 was observed. In the apparatus of the present mode of implementation, control unit 47 is configured so that neither electrostatic attraction mechanism 43 nor pressurizing gas introduction system 42 are operated during period T1, but they are operated during period T2.

As can be seen from the temperature increase pattern shown by the dashed line drawn with double dots in FIG. 3, the substrate is kept at a low temperature of as little as 50° C. or thereabouts during period T1. Then, in period T2, its temperature is rapidly increased from about 50° C. to about 500° C. With this sort of temperature increase pattern no gaps form in the abovementioned base film 81, and hot reflow sputtering is performed normally as shown in FIGS. 4(A) through (C). The present inventors' research has confirmed that when the metallic material is aluminum or ail aluminum alloy, no gaps occur in the base film 81 if the substrate temperature does not exceed 100° C. during this period T1.

In the apparatus of the present mode of implementation, the period T2 shown in FIG. 3 is subdivided into a period T2A in which electrostatic attraction mechanism 43 is operated and pressurizing gas introduction system 42 is not operated, and a subsequent period T2B in which electrostatic attraction mechanism 43 and pressurizing gas introduction system 42 are both operated.

If pressurizing gas introduction system 42 is operated before substrate 9 is electrostatically gripped against substrate holder 4, or virtually simultaneously with the electrostatic gripping thereof, a problem arises in that substrate 9 is inadequately gripped against substrate holder 4 even when the electrostatic attraction mechanism 43 is operated. If electrostatic attraction mechanism 43 starts to operate when pressurizing gas is being introduced into indentation 40, it will try to grip substrate 9 electrostatically while pressurizing gas is leaking out from indentation 40, and substrate 9 will not be gripped adequately even if static electricity is induced in it.

In the apparatus of the present mode of implementation, the electrostatic attraction mechanism 43 is operated first, and the pressurizing gas introduction system 42 is operated after the electrostatic grip of substrate 9 has become stable. Accordingly, period T2A in FIG. 3 is a period of, for example, 5 to 10 seconds or so during which the electrostatic grip becomes stable.

In this way the control unit 47 in the apparatus of the present mode of implementation operates neither electrostatic attraction mechanism 43 nor pressurizing gas introduction system 42 during the first step in which a thin base film 81 is deposited, whereas in the second step that follows the first step it first operates electrostatic attraction mechanism 43 and then operates pressurizing gas introduction system 42. Control unit 47 is a control system including a microcomputer. Control unit 47 is configured from—inter alia—an input unit that inputs a processing program, a memory unit that stores the processing program input from the input unit and a signal output unit that sends a sequence of operating signals to other parts such as the electrostatic attraction power source of the electrostatic attraction mechanism and the valve of the pressurizing gas introduction system, according to the processing program read in from the memory unit.

The hot reflow sputtering apparatus of the present mode of implementation is ideally configured as a multi-chamber system. A multi-chamber system is provided with a central transfer chamber with airtight connections to a plurality of process chambers and load lock chambers around it. Ideally, one of the plurality of process chambers is configured as a sputtering chamber that deposits base film 81 (i.e., performs the first step), and another chamber is configured as a sputtering chamber that deposits the reflow film 82 and performs reflow (i.e., performs the second step).

Since the first step and second step are performed in separate sputtering chambers with this configuration, the throughput is increased. Between the first step and second step, the substrate is transferred in vacuo via the transfer chamber, and so contamination of base film 81 is not a problem.

To describe an embodiment of a hot reflow sputtering method according to the present invention, the conditions are described for an embodiment that achieves the temperature increase pattern shown by the dashed line drawn with double dots in FIG. 3.

To perform hot reflow sputtering with the temperature increase pattern shown by the dashed line drawn with double dots in FIG. 3, argon is first introduced as the process gas and the pressure inside the sputtering chamber is maintained at about 0.5 to 2 mTorr. In this state, the first step of producing base film 81 is performed by sputtering with a maximum output power from the sputtering power source of about 18 kW. Here, heater 6 is operated with a power of about 500 W, but electrostatic attraction mechanism 43 and pressurizing gas introduction system 42 are not operated. These conditions are held for about 10 seconds to form the base film 81. After about 10 seconds have elapsed, the temperature of substrate 9 is about 50° C. as shown in FIG. 3.

After that, the second step is performed. In the second step, the output of sputtering power source 3 is set to about 7 kW to reduce the film deposition rate. Electrostatic attraction power source 432 is then operated to apply a voltage of about 500 V to the pair of electrostatic attraction electrodes 431. Substrate 9 is thereby gripped by substrate holder 4. After about 5 to 10 seconds have elapsed and the electrostatic grip has stabilized (i.e., at the end of period T2A), the temperature of substrate 9 is increased to about 200° C. as shown in FIG. 3.

In the subsequent period T2B, pressurizing gas introduction system 42 is operated and pressurizing gas (in this case, argon) is introduced into indentation 40. The pressure inside indentation 40 is thereby increased to about 10 Torr. During this period T2B, the output of sputtering power source 3 is set to about 4 kW. After this state has been maintained for about 20 seconds (i.e., at the end of period T2B), the temperature of substrate 9 has risen to about 500° C. as shown in FIG. 3. During this period of temperature increase, the output power of heater 6 is kept constant at 500 W while the temperature of substrate 9 is gradually increased through a gradual sequence of operations whereby electrostatic attraction mechanism 43 is operated on its own and then electrostatic attraction mechanism 43 and pressurizing gas introduction system 42 are operated together.

At the end of period T2B, the heat supplied from heater 6 reaches thermal equilibrium and the temperature of substrate 9 stabilizes at about 500° C. In period T2C, sputtering is continued at a power of 4 kW while keeping the substrate heated to about 500° C. for about 80 seconds, whereupon the filling in of holes 90 with metallic material by hot reflow sputtering is completed. In the operations of the above embodiment, the material of target 2 is aluminum or an aluminum alloy, and the holes are filled in with aluminum or aluminum alloy.

With the abovementioned embodiment, it takes about 90 to 100 seconds (T1+T2A+T2B+T2C in FIG. 3) to complete the filling in of holes that are 0.3 μm in diameter and 1 μm deep. With the conventional temperature increase pattern shown by the solid line in FIG. 3, period T2 (the period of the second step) would have required about 200 to 300 seconds. The configuration of the present embodiment is thus able to cut the processing time by at least a half.

In the abovementioned mode of implementation and embodiment the configuration used to obtain the optimum temperature increase pattern is arranged so that the power supplied to heater 6 is kept constant while electrostatic attraction mechanism 43 and pressurizing gas introduction system 42 are operated gradually. However, it is also possible to control the power supplied to heater 6 gradually while electrostatic attraction mechanism 43 and pressurizing gas introduction system 42 are operated continuously. It is also possible to control the apparatus so that conductivity of heat from substrate holder 4 to substrate 9 is gradually increased—this might be done by gradually increasing the output of electrostatic attraction power source 432 in electrostatic attraction mechanism 43, or by gradually increasing the pressure inside the indentation by gradually increasing the amount of gas introduced by pressurizing gas introduction system 42. However, the present inventors' studies have shown that, compared with these other control methods, the configuration whereby electrostatic attraction mechanism 43 and pressurizing gas introduction system 42 are operated gradually has the advantages of superior responsivity and the ability to control the temperature increase pattern of substrate 9 with high precision.

Although aluminum or aluminum alloy were used as the metallic material in the abovementioned description, the invention of the present application can also be applied to the hot reflow sputtering of other metallic materials such as copper or copper alloy.

As described above with the present invention it is possible to effectively suppress the occurrence of voids due to gaps in the base film while reducing the time required for hot reflow sputtering by heating the substrate rapidly. With the present invention a high-quality hot reflow sputtering process can be implemented with high productivity.

The high responsivity of temperature control in the present invention makes it possible to control the temperature increase pattern with high precision and to further improve the process quality.

Furthermore, in the present invention the pressurizing gas introduction system is only operated after the electrostatic attraction mechanism has been operated and the electrostatic grip has become stable thereby completely avoiding problems due to improper gripping of the substrate.

While the invention has been described with reference to preferred embodiments it is to be understood that variations and modifications may be resorted to as will be apparent to those skilled in the art. Such variations and modifications are to be considered within the purview and scope of the invention as defined by the claims appended hereto.

What is claimed is:

1. A hot reflow sputtering method that fills in minute holes formed in a substrate with a metallic material, said method comprising the steps of:

(a) forming a thin base film of the metallic material on side and bottom surfaces of the holes formed in the substrate at a first temperature in a sputtering apparatus comprising an electrostatic attraction mechanism (EAM) for electrostatically gripping the substrate and a pressurizing gas introduction system (PGIS) for introducing pressurizing gas into a substrate holder having an indentation; and (b) subsequently performing hot reflow sputtering on the substrate after step (a) to fill in the holes with the metallic material, wherein step (b) is carried out in at least two stages (b1) and (b2), stage (b1) is carried out, with the EAM operating and the PGIS not operating, to heat the substrate to a temperature higher than the first temperature of the substrate during the formation of the thin base film of step (a), and stage (b2) is carried out, with both the EAM and the PGIS operating to further heat the substrate to a temperature higher than the temperature in stage (b1).

2. The method according to claim 1, wherein step (a) is carried out with both the EAM and the PGIS not operating.

3. The method according to claim 2, wherein step (a) is carried out for about 10 seconds and at a temperature of 100° C. or less.

4. The method according to claim 1, wherein stage (b1) is carried out for a period of time sufficient to stabilize the electrostatic grip on the substrate.

5. The method according to claim 4, wherein said period of time is from about 5 to 10 seconds.

6. The method according to claim 1, wherein said sputtering apparatus comprises a plurality of sputtering chambers and step (a) is carried out in one chamber and step (b) is carried out in another chamber.

7. A hot reflow sputtering apparatus for forming a thin base film of a metallic material on side and bottom surfaces of minute holes formed in a substrate and for filling in the holes with the metallic material by hot reflow sputtering, said apparatus comprising:

a substrate holder having an indentation formed on a surface thereof for holding the substrate;

a heater for heating the substrate during deposition of said thin film base to a first temperature;

an electrostatic attraction mechanism (EAM) for electrostatically gripping the substrate against the substrate holder with static electricity; and a pressurizing gas introduction system (PGIS) for introducing a pressurizing gas into the indentation;

a control unit which, during hot reflow sputtering, first operates the EAM without operating the PGIS for a period of time sufficient to stabilize the electrostatic grip on the substrate to a second temperature that is higher than the first temperature, and which then operates the EAM and PGIS together to further heat the substrate to a third temperature that is higher than the second temperature.

8. The apparatus according to claim 7, wherein the control unit operates neither the EAM nor the PGIS during formation of a thin base film.

9. The apparatus according to claim 7, which comprises a plurality of sputtering chambers.

10. The method according to claim 1, wherein the heating of the substrate during stage (b1) of step (b) is performed by way of conduction between the substrate holder and the substrate, without the use of pressurizing gas and wherein the substrate is held in direct contact with the substrate holder by a plurality of projections substantially uniformly interspersed over the entire area of the substrate, thereby increasing a gripping force between the substrate and the substrate holder.

11. The apparatus according to claim 7, wherein the substrate is held in direct contact with the substrate holder by a plurality of projections substantially uniformly interspersed over the entire area of the substrate.

12. The apparatus according to claim 11, wherein the indentation formed in the substrate holder is formed by an annular projection extending around an outer edge of the substrate holder and the plurality of projections substantially uniformly interspersed on an inside of the annular projection.

13. The apparatus according to claim 7, wherein the control unit includes means for increasing the temperature of the substrate by way of conduction between the substrate holder and the substrate, without the use of pressurizing gas.

* * * * *